United States Patent
Boden, Jr.

(10) Patent No.: US 6,452,230 B1
(45) Date of Patent: Sep. 17, 2002

(54) HIGH VOLTAGE MOSGATED DEVICE WITH TRENCHES TO REDUCE ON-RESISTANCE

(75) Inventor: Milton J. Boden, Jr., Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/471,343

(22) Filed: Dec. 23, 1999

Related U.S. Application Data

(60) Provisional application No. 60/113,641, filed on Dec. 23, 1998.

(51) Int. Cl.⁷ ............................................... H01L 29/76
(52) U.S. Cl. ........................ 257/341; 257/329; 257/342
(58) Field of Search ................................. 257/192, 194, 257/195, 208, 296–297, 301, 302, 305, 408, 501, 502, 504, 506, 508, 510, 520, 326–329, 336, 341–344

(56) References Cited

U.S. PATENT DOCUMENTS

| | | | |
|---|---|---|---|
| 4,315,782 A | * 2/1982 | Tarng | 148/1.5 |
| 4,754,310 A | 6/1988 | Coe | 257/287 |
| 5,007,725 A | 4/1991 | Manzoni | 359/873 |
| 5,216,275 A | 6/1993 | Chen | 257/493 |
| 5,549,762 A | 8/1996 | Cantarini | 136/249 |
| 6,184,555 B1 | * 2/2001 | Tihanyi et al. | 257/342 |
| 6,194,773 B1 | * 2/2001 | Malhi | 257/502 |

FOREIGN PATENT DOCUMENTS

JP        5724469 A   * 8/1982

* cited by examiner

Primary Examiner—Minh Loan Tran
Assistant Examiner—Thomas L Dickey
(74) Attorney, Agent, or Firm—Ostrolenk, Faber, Gerb & Soffen, LLP

(57) ABSTRACT

Parallel, spaced SIPOS (semi-insulating polysilicon) filled trenches extend vertically through the epi layer of a MOS-gated device and act to deplete carriers from the vertical conduction volume of the epi between trenches during voltage blocking conditions. Thus, a higher conductivity epi can be used to reduce the $R_{DSON}$ (Drain to Source ON resistance) of the device for a given break down voltage.

7 Claims, 2 Drawing Sheets

HIGH VOLTAGE MOSGATED DEVICE WITH TRENCHES TO REDUCE ON-RESISTANCE

CROSS REFERENCE TO RELATED APPLICATION

This application is based on and claims priority to U.S. Provisional Patent Application No. 60/113,641, filed Dec. 23, 1998, the entire disclosure of which is hereby incorporated by reference.

BACKGROUND OF THE INVENTION

This invention relates to MOSgated devices and more specifically relates to a novel super junction-type device and method for its manufacture, which has a low on-resistance and high breakdown voltage.

MOSgated devices such as power MOSFETs, IGBTs, and gate turn on thyristors are well known. A typical MOSgated device of this type is shown in U.S. Pat. No. 5,007,725. These devices may be made with a closed cellular base or spaced striped base topology. A device termed a COOLFET device made by Siemens Corporation, consists of a device in which spaced trenches form small width areas of increased conductivity epitaxially formed silicon. The higher conductivity epi reduces on-resistance, but is depleted under blocking voltage conditions to provide a high breakdown voltage. Such devices, termed superjunctions, are described in U.S. Pat. Nos. 4,754,310 and 5,216,275. This invention provides an improved device of the COOLFET type in which simpler manufacturing and improved operation is provided.

BRIEF DESCRIPTION OF THE INVENTION

In accordance with the invention, a semi-insulating material, preferably a semi-insulating polysilicon or other non-injecting material fills vertically oriented parallel spaced trenches which extend completely through a depletable epitaxial silicon layer and reach, or are closely spaced from, the conductive silicon substrate which supports the epitaxial layer. The trenches could be lined with highly insulative silicon dioxide (to prevent injection) and then filled with conventional conductive polysilicon. A similar structure is used in termination of the chip.

DETAILED DESCRIPTION OF THE DRAWINGS

Figure 1:
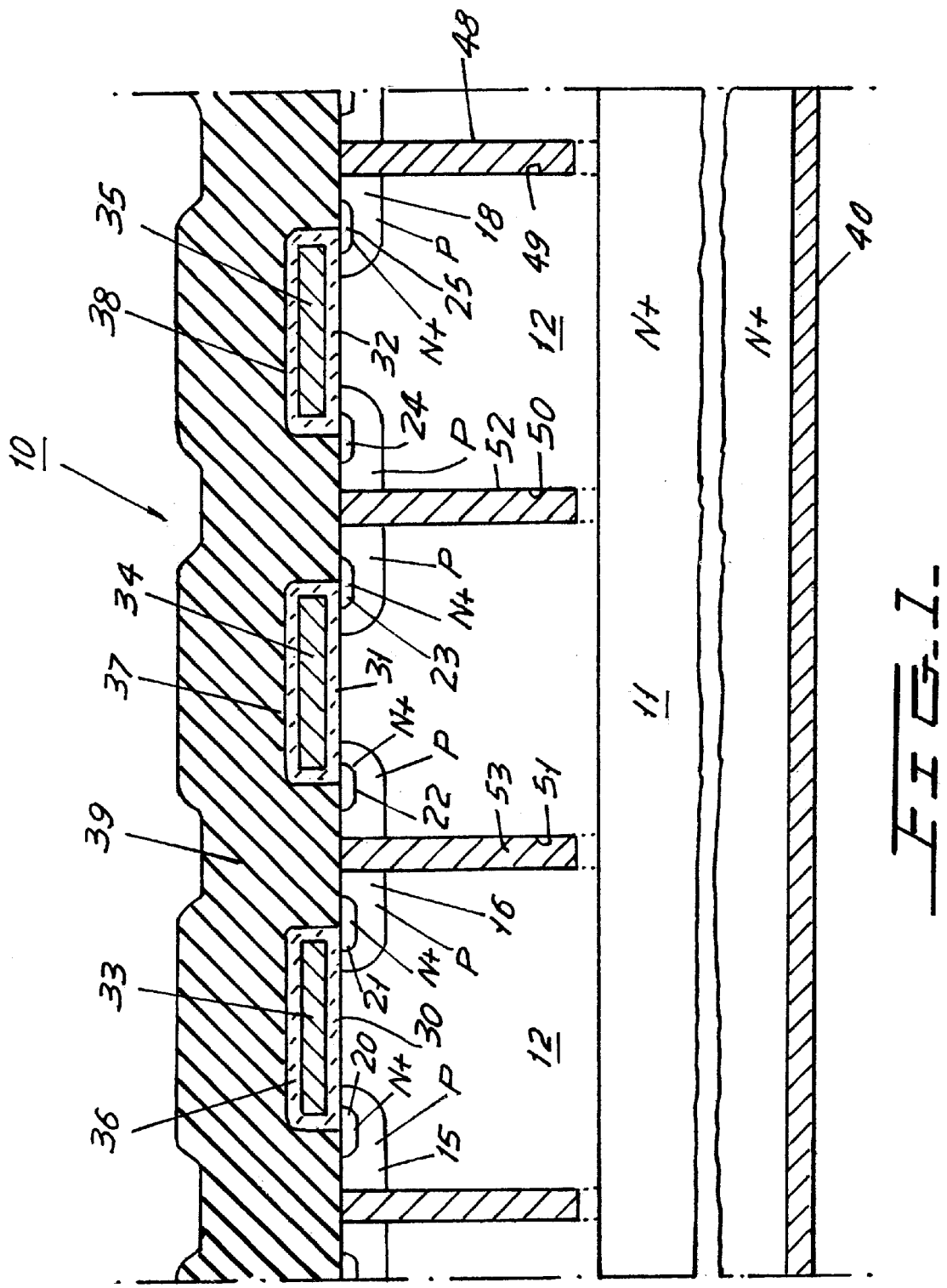
FIG. 1 is a cross-section of the active portion of a semiconductor chip which uses the present invention.

FIG. 1 is a cross-section of the active area of a high voltage vertical conduction D-MOS device made in accordance with the invention. While any suitable topology can be used, the embodiment of FIG. 1 is carried out with a parallel spaced stripe design as will be later described.

A significant portion of the on-resistance $R_{DSON}$ of prior art devices is produced in the $N^-$ epitaxial layer (for an N channel device). The thickness and resistivity of this layer is chosen to meet the breakdown voltage of the device. Thus, the higher the breakdown voltage is to be, the greater the thickness and the higher the resistivity. Both conditions increase the device $R_{DSON}$.

The present invention permits the use of a lower resistivity $N^-$ epi layer for a given breakdown voltage, thus reducing $R_{DSON}$ for a given breakdown voltage.

Referring to FIG. 1, there is shown a portion of a MOSgated chip 10 which consists of an $N^+$ silicon substrate 11 which has an $N^-$ epitaxially grown junction-receiving silicon layer 12 thereon. The thickness and resistivity of $N^-$ layer 12 is chosen in accordance with the desired breakdown voltage of the device to be formed. The invention is described herein for an N channel device. The invention can be employed in a P channel device by reversing all concentration types.

Elongated parallel base diffusion strips 15, 16, 17 and 18 are formed in the top surface of layer 12 by any suitable well known photolithographic process. A typical process will include the opening of elongated windows in a masking layer (which may include a poly-silicon gate and underlying gate oxide), the implant of a suitable P type impurity such as boron and the subsequent diffusion of the impurity. $N^+$ source regions 20 to 25 are next formed as spaced pairs in each of the P regions 15 to 18 to form invertible channels along the opposite edges of each of bases 15 to 18. These invertible channels are covered by MOSgates consisting of gate insulation layers (preferably silicon dioxide) 30 to 32 covered by conductive polysilicon gate electrodes 33 to 35 respectively. Gate electrodes are then covered by insulation layers (LTO) 36 to 38 respectively which insulates the gates from the overlying source electrode 39. A drain electrode 40 is applied to the bottom of substrate 11.

The structure of FIG. 1 described to this point is that of a conventional planar stripped geometry MOSFET of the kind shown in pending application serial No. 60/107,700, filed Nov. 9, 1998, the disclosure of which is incorporated herein by reference. In accordance with the invention, vertical trenches 49, 50, 51 are cut at least partly through the epi layer 12 and bisect each of the base strips 16 and 17, and all other base strips. FIG. 1 shows trenches 50 and 51 as ending just short of the full thickness of epi layer 12, but they can extend to reach the $N^+$ layer 11 as shown in dotted lines. These trenches 49, 50 and 51 are then filled with fillers 48, 52 and 53 respectively, of high resistivity, non-injecting material, preferably SIPOS which is a semi-insulation polysilicon. SIPOS can be formed by adding oxygen during the deposition of polysilicon fillers 48, 52 and 53. The addition of oxygen during this process changes the character of the polysilicon from a semiconductor to an insulation, as is known in the art.

The trenches 49, 50 and 51 are made as thin as possible to reduce leakage current during operation. For example, a trench width of 1 micron is acceptable, although larger widths are permissible and smaller widths are desirable.

The depth of the trenches 49, 50 and 51 will depend on the thickness of epi layer 11, and may be about 40 microns for a device having a 400 to 500 volt breakdown. While any desired wafer structure (in which a large number of chips are simultaneously formed), the ultra-thin wafer described in U.S. Pat. No. 5,549,762 (Cantarini) is well adapted for use with the present invention.

The novel structure of FIG. 1 allows the use of a lower resistivity for epi 12 for a given breakdown voltage. The trenches 49, 50 and 51 are spaced close enough that the lateral field during a blocking condition will deplete electrons from the $N^-$ epi between trenches, holding the transistor off. The resistivity of the SIPOS fillers 48, 52 and 53 is chosen to provide this lateral field without excessive current leakage. During forward conduction of the device, the lower resistivity of the epi 12 reduces the $R_{DSON}$ of the device.

Figure 2:
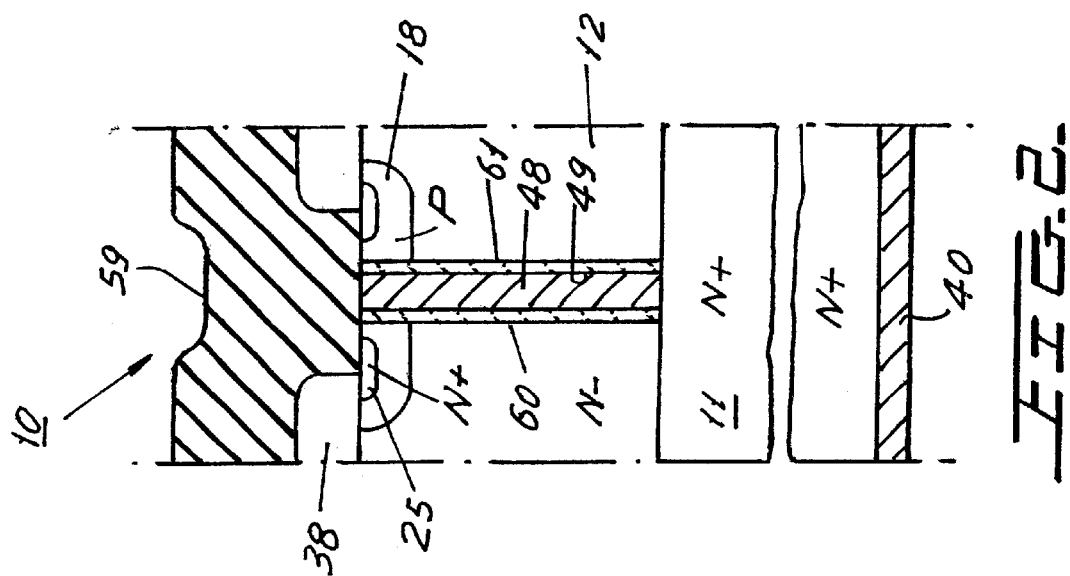
FIG. 2 is a portion of the trench of FIG. 1 which has a modified structure.

FIG. 2 shows a second embodiment of the invention in which elements similar to those of FIG. 1 have the same identifying numeral. FIG. 2 shows that the trenches, for example, trench 49 of FIG. 1 can be lined with a high resistivity material, for example, silicon dioxide layers 60 and 61 before filling with SIPOS filler 48 (or polysilicon) to further reduce leakage current. Care should be taken to ensure that all P diffusions are suitably connected together when using the embodiment of FIG. 2.

Figure 3:
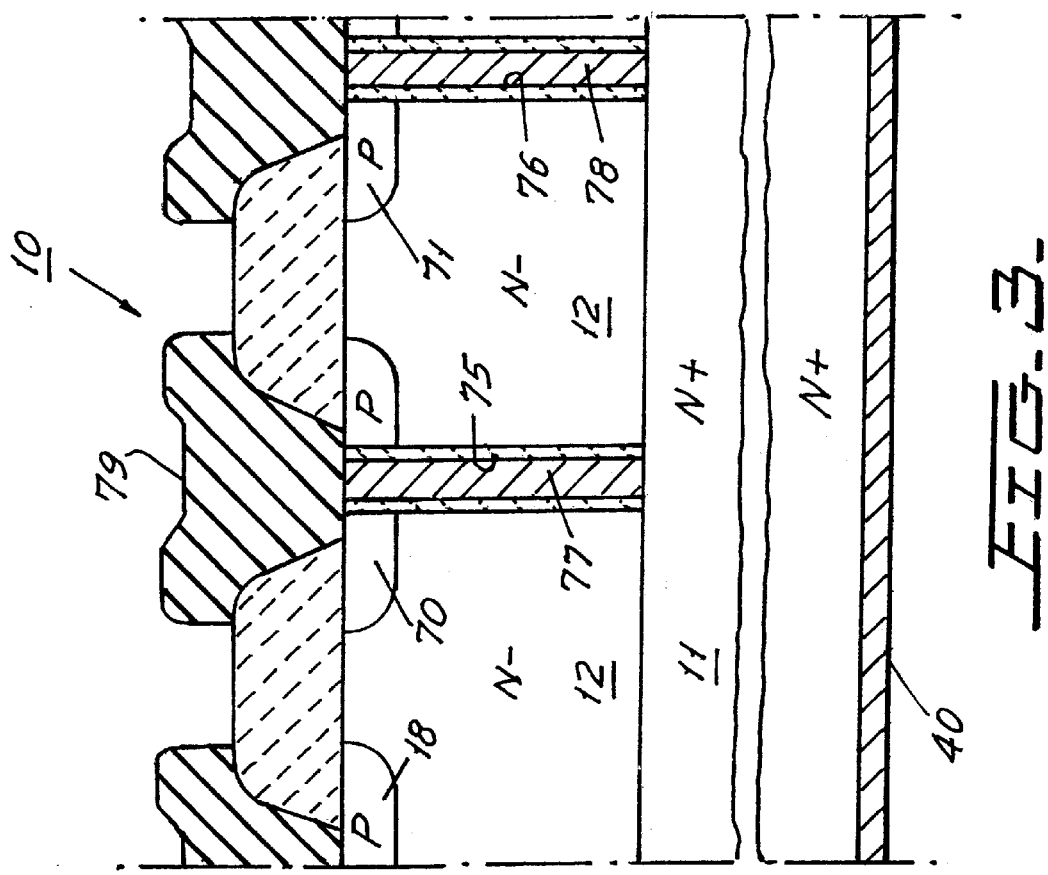
FIG. 3 is a cross-section of the termination portion of the chip of FIGS. 1 and 2.

FIG. 3 shows a termination structure which can be used for the chip 10, using the same process steps used in Figures and 2 for the formation of trenches 49, 50 and 51. Thus, in the termination region, further P diffusions 70 and 71 are formed, but no source is formed in these termination diffusions (which may encircle the chip). Trenches 75 and 76 and other concentric trenches bisect their respective bases 70 and 71 and are lined with SiO$_2$ layers and are filled with SIPOS or polysilicon fillers 77 and 78 respectively. Spaced conductive rings 79 and 80, which float relative to source 39, contact P regions 70 and 71 and fillers 77 and 78 respectively. Thus, the epi regions 12 between trenches 75 and 76 and regions on opposite sides of these trenches deplete during blocking or reverse voltage conditions.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high voltage MOSgated device of low on-resistance comprising, in combination; a thin flat chip of silicon having a main body layer of one conductivity type and having relatively high concentration and a junction-receiving layer of said one conductivity type and of a relatively lower concentration disposed atop said main body layer; a plurality of spaced base diffusions of the other conductivity type formed in the upper surface of said junction receiving layer and a plurality of source regions of said one conductivity type formed in respective ones of said base diffusions to define invertable channel regions laterally spaced from one another by a vertical conduction channel region in said junction receiving layer; and a MOSgate structure disposed above each of said invertible channels and responsive to a suitable MOSgate input signal; a plurality of spaced thin trenches extending vertically from the top of said junction receiving layer for at least a major portion of the thickness of said junction receiving layer; a first main contact disposed above the top surface of said junction receiving layer and in contact with said source and base diffusions and said trenches; a second main contact formed on the bottom of said main body layer; said trenches defining between them vertical depletable vertical conduction regions in said junction receiving layer for the length of said trenches; each of said trenches being filled with a semi-insulating, non-injecting material which is relatively incapable of carrier injection into the junction receiving layer.

2. The device of claim, 1 wherein said semi-insulating material comprises a SIPOS semi-insulating polysilicon.

3. The device of claim 1, wherein said trenches are lined with silicon dioxide and are filled with polysilicon.

4. The device of claim 1, wherein said trenches have a depth which reaches said body layer.

5. The device of claim 2, wherein said trenches have a depth which reaches said body layer.

6. The device of claim 3, wherein said trenches have a depth which reaches said body layer.

7. The device of claim 1 wherein said trenches have a width of about 1 micron.

* * * * *